(12) United States Patent
Tezuka et al.

(10) Patent No.: US 8,476,153 B2
(45) Date of Patent: Jul. 2, 2013

(54) METHOD OF MANUFACTURING A SEMICONDUCTOR DEVICE

(75) Inventors: Tomoyuki Tezuka, Sagamihara (JP); Mahito Shinohara, Tokyo (JP); Yasuhiro Kawabata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/349,062

(22) Filed: Jan. 12, 2012

(65) Prior Publication Data

US 2012/0196429 A1 Aug. 2, 2012

(30) Foreign Application Priority Data

Feb. 1, 2011 (JP) ................... 2011-020088
Nov. 29, 2011 (JP) ................... 2011-261009

(51) Int. Cl.
*H01L 21/425* (2006.01)

(52) U.S. Cl.
USPC ............ 438/517; 438/522; 438/530; 438/531

(58) Field of Classification Search
USPC .................. 438/514, 522, 530, 531, 944, 945
See application file for complete search history.

(56) References Cited

U.S. PATENT DOCUMENTS

| 7,759,186 B2 * | 7/2010 | Imhoff et al. ................. 438/212 |
| 2010/0321518 A1 | 12/2010 | Shinohara et al. |

FOREIGN PATENT DOCUMENTS

| JP | 2001-237326 A | 8/2001 |
| JP | 2002-231924 A | 8/2002 |
| JP | 2006-165143 A | 6/2006 |
| JP | 2006-165161 A | 6/2006 |
| JP | 2006-196769 A | 7/2006 |
| JP | 2011-003716 A | 1/2011 |

* cited by examiner

*Primary Examiner* — Kevin M Picardat
(74) *Attorney, Agent, or Firm* — Fitzpatrick, Cella, Harper & Scinto

(57) ABSTRACT

A method of manufacturing a semiconductor device that includes a semiconductor substrate is provided. The method includes: exposing a photoresist coated on the semiconductor substrate using a photomask including a plurality of regions having different light transmittances; developing the photoresist to form a resist pattern including a plurality of regions having different thicknesses that depend on an exposure amount of the photoresist; and implanting impurity ions into the semiconductor substrate through the plurality of regions of the resist pattern having different thicknesses to form a plurality of impurity regions whose depths from a surface of the semiconductor substrate to peak positions are different from each other. The depths to the peak positions depend on the thickness of the resist pattern through which the implanted impurity ions pass.

17 Claims, 4 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device.

2. Description of the Related Art

A known method of forming impurity regions within a semiconductor substrate includes a photolithography step in which a resist pattern is formed on a semiconductor substrate and an ion implantation step in which impurity ions (that is, ions for forming impurity regions) are implanted into the semiconductor substrate by using the resist pattern. The impurity ions implanted toward a portion of the resist pattern from which the photoresist has been removed reach into the semiconductor substrate, forming an impurity region. On the other hand, the impurity ions implanted toward a portion of the resist pattern in which the photoresist remains do not reach the semiconductor substrate, and thus no impurity region is formed within the semiconductor substrate. As described above, ion implantation is performed using resist patterns corresponding to impurity regions that need to be formed. Hereinafter, the photolithography step and the ion implantation step will be collectively referred to as an "impurity region forming step". The concentration distribution in the depth direction of the impurity region depends on the conditions for implantation of impurity ions. Accordingly, forming a plurality of impurity regions having different concentration distributions in the depth direction requires as many times of the impurity region forming step as the number of impurity regions.

According to the technique disclosed in Japanese Patent Laid-Open No. 2006-196769, the openings of respective resist patterns used in two times of the impurity region forming step are partially overlapped with each other, whereby three types of impurity regions having different concentration distributions in the depth direction are formed. This reduces the number of times of the impurity region forming step.

With conventional methods, the depths of the peak positions of impurity concentration of impurity regions formed in a single time of the impurity region forming step depend on the ion implantation conditions. Accordingly, in order to form a plurality of impurity regions whose depths from the semiconductor substrate surface to the peak positions are different from each other within a semiconductor substrate, the impurity region forming step needs to be performed on each of the impurity regions. Even when the technique disclosed in Japanese Patent Laid-Open No. 2006-196769 is used, a plurality of impurity regions whose depths to the peak positions of impurity concentration are different from each other cannot be formed with a single time of the ion implantation step.

SUMMARY OF THE INVENTION

An aspect of the present invention provides a technique for forming a plurality of impurity regions whose depths to the peak positions of impurity concentration are different from each other within a semiconductor substrate, with a smaller number of steps than that of conventional technology.

A first aspect of the present invention provides a method of manufacturing a semiconductor device that includes a semiconductor substrate, the method comprising: exposing a photoresist coated on the semiconductor substrate using a photomask including a plurality of regions having different light transmittances; developing the photoresist to form a resist pattern including a plurality of regions having different thicknesses that depend on an exposure amount of the photoresist; and implanting impurity ions into the semiconductor substrate through the plurality of regions of the resist pattern having different thicknesses to form a plurality of impurity regions whose depths from a surface of the semiconductor substrate to peak positions are different from each other, wherein the depths to the peak positions depend on the thickness of the resist pattern through which the implanted impurity ions pass.

A second aspect of the present invention provides a method of manufacturing a semiconductor device that includes a semiconductor substrate, the method comprising: exposing a photoresist coated on a film made of an inorganic material using a photomask including a plurality of regions having different light transmittances; developing the photoresist to form a resist pattern including a plurality of regions having different thicknesses that depend on an exposure amount of the photoresist; performing etching using the resist pattern as a mask to form an inorganic material pattern from the inorganic material film, the inorganic material pattern including a plurality of regions having different thicknesses; and implanting impurity ions into the semiconductor substrate through the plurality of regions of the inorganic material pattern having different thicknesses to form a plurality of impurity regions whose depths from a surface of the semiconductor substrate to peak positions are different from each other, wherein the depths to the peak positions depend on the thickness of the inorganic material pattern through which the implanted impurity ions pass.

A third aspect of the present invention provides a method of manufacturing a semiconductor device that includes a plurality of impurity regions within a semiconductor substrate, the method comprising: implanting impurity ions into the semiconductor substrate through a plurality of regions of a resist pattern having different thicknesses to form the plurality of impurity regions whose depths from a surface of the semiconductor substrate to peak positions are different from each other, wherein the depths to the peak positions depend on the thickness of the resist pattern through which the implanted impurity ions pass.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Embodiments of the present invention will be described with reference to the accompanying drawings. The following embodiments can be combined with each other. An example of a method of forming, within a semiconductor substrate, a plurality of impurity regions whose depths from the surface of a semiconductor substrate to the peak positions of impurity concentration are different from each other will be described first with reference to FIGS. 1A to 1D and FIG. 2. Then, an example of a method of manufacturing a semiconductor device using the method of forming impurity regions will be described with reference to FIGS. 3A to 3D. In this specification, unless otherwise stated, the term "depth to the peak position of impurity concentration" refers to the depth from the surface of the semiconductor substrate to the peak position of impurity concentration of an impurity region.

Figure 1A:
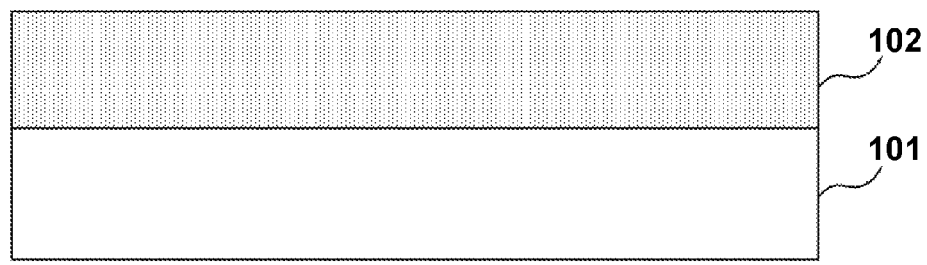
FIGS. 1A to 1D are diagrams illustrating a method of forming impurity regions according to an embodiment of the present invention.
Figure 1B:
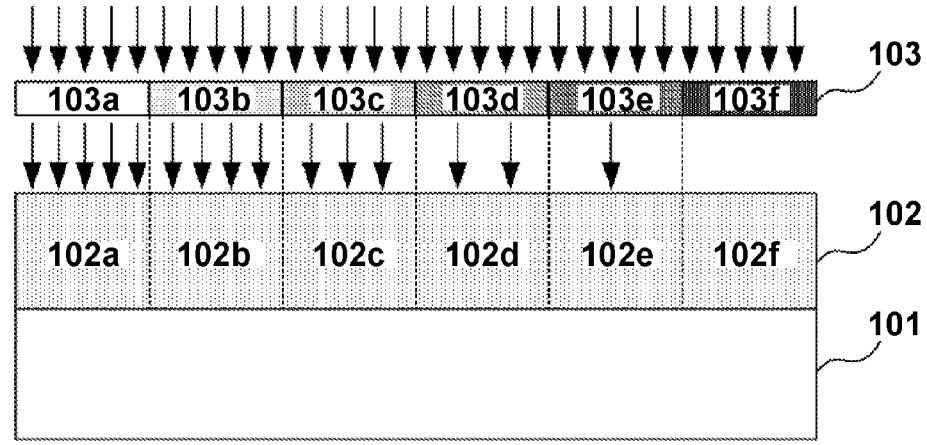

Each step of a method of forming impurity regions within a semiconductor substrate according to an embodiment of the present invention will be described with reference to FIGS. 1A to 1D. As will be described in detail below, the method enables formation of a plurality of impurity regions having peak positions at different depths of a semiconductor substrate by performing a photolithography step using a photomask having a multi-level pattern. First, as shown in FIG. 1A, a photoresist 102 is uniformly coated on a semiconductor substrate 101. Next, as shown in FIG. 1B, the photoresist 102 is exposed using a photomask 103. In this example, the photoresist 102 is positive.

Figure 2:
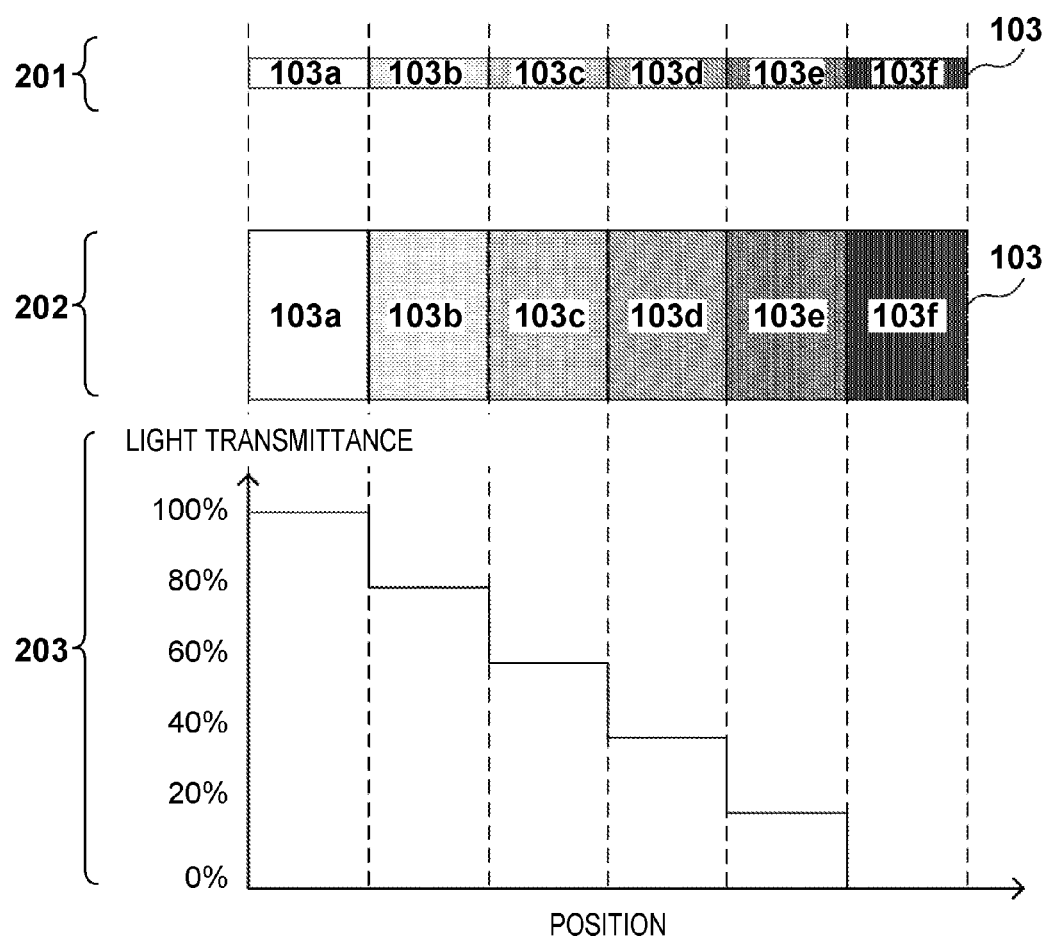
FIG. 2 is a diagram illustrating a multi-level photomask according to an embodiment of the present invention.

Here, the photomask 103 will be described with reference to FIG. 2. In FIG. 2, 201 shows a schematic cross-section view of the photomask 103, 202 shows a schematic plan view of the photomask 103, and 203 shows a graph representing the relationship between positions in the photomask 103 and the light transmittances. The photomask 103 is a photomask having a multi-level pattern, and may include a plurality of regions 103a to 103f having different light transmittances. In the present embodiment, as shown in the graph 203, the region 103a has a light transmittance of 100%, and the regions 103b to 103f have a light transmittance of 80%, 60%, 40%, 20% and 0%, respectively. Since the region 103f has a light transmittance of 0%, the region 103f can serve as a light-shielding portion. The photomask having a multi-level pattern may be a gray-tone mask or half-tone mask. The gray-tone mask is a photomask whose light transmittance level has been adjusted by forming openings smaller than or equal to the resolution of an exposure apparatus in the photomask 103. With the gray-tone mask, the light transmittance level can be adjusted with the size or density of openings. The half-tone mask is a photomask formed from a combination of a light-shielding film and a semi-light-transmitting film. A plurality of light transmittance levels can be selected for the semi-light-transmitting film of the half-tone mask.

By exposing the photoresist 102 using the photomask 103 described with reference to FIG. 2, the exposure amounts of regions 102a to 102f of the photoresist 102 differ from each other as shown in FIG. 1B. As can be seen from FIG. 1B in which the intensity of exposure light is schematically indicated by the number of arrows, the exposure amount is greatest at the region 102a and decreases from the region 102a toward the region 102f, and the region 102f is not exposed. As described above, the exposure amount of the photoresist 102 varies depending on the light transmittance of the photomask 103. Specifically, the higher the light transmittance of the photomask 103, the greater the exposure amount of the photoresist 102 will be. The light transmittance, or in other words, the exposure amount can be set based on the exposure amount and residual thickness of the photoresist that is used.

Figure 1C:
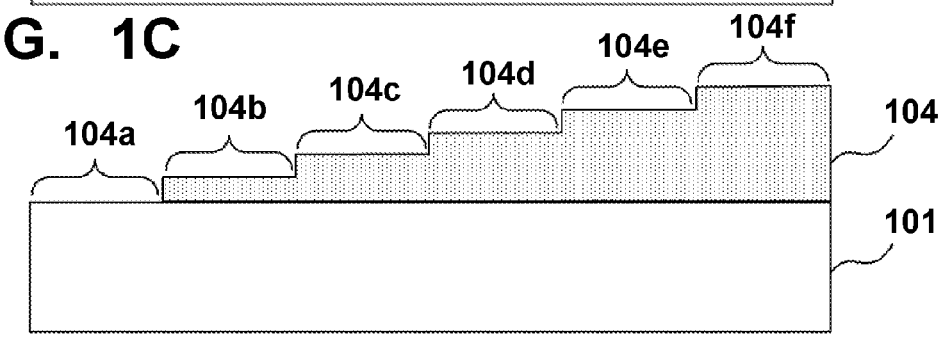

Next, as shown in FIG. 1C, the exposed photoresist 102 is developed to form a resist pattern 104. Since the exposure amount differs for each of the regions 102a to 102f of the photoresist 102, the development of the photoresist 102 produces the resist pattern 104 including a plurality of regions 104a to 104f having different thicknesses. Specifically, the region 102a of the photoresist 102 exposed with the greatest exposure amount is removed through the development, as a result of which the thickness at the region 104a of the resist pattern 104 will be zero. Likewise, the thickness of the resist pattern 104 that has not been removed and remains increases as the exposure amount decreases from the region 104b to the region 104f. In particular, the region 102f of the photoresist 102 is not exposed, and therefore it remains as the region 104f of the resist pattern 104.

Figure 1D:
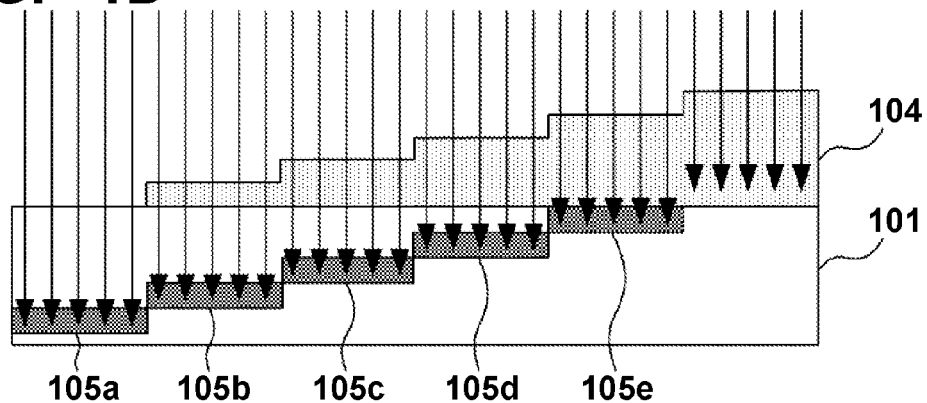

Next, as shown in FIG. 1D, impurity ions are implanted into the semiconductor substrate 101 through the resist pattern 104. The depth of the peak position of each impurity region formed by the impurity ions implanted into the semiconductor substrate 101 depends on the thickness of the resist pattern 104. That is, the thinner the resist pattern 104, the deeper the peak position of the impurity region will be. Specifically, the region 104a of the resist pattern 104 has a thickness of zero, and therefore the impurity ions that have passed through the region 104a form an impurity region 105a at the position where the peak position is deepest. The impurity ions that have passed through the regions 104b to 104e of the resist pattern 104 form impurity regions 105b to 105e, respectively, and the peak position shifts deeper in this order. Meanwhile, the impurity ions implanted into the region 104f which is the thickest of the resist pattern 104 cannot pass through the region 104f and do not reach the semiconductor substrate 101, and therefore does not form an impurity region within the semiconductor substrate 101. As described above, with the ion implantation using the resist pattern 104 including a plurality of regions having different thicknesses, the plurality of impurity regions 105a to 105e having different depths to the peak positions are formed simultaneously. After the impurity regions 105a to 105e have been formed, the resist pattern 104 on the semiconductor substrate 101 is removed.

As described above, with the method of forming impurity regions of the present embodiment, it is possible to form a plurality of impurity regions whose depths to the peak positions are different from each other, by performing a single time of photolithography and a single time of ion implantation.

Figure 3A:
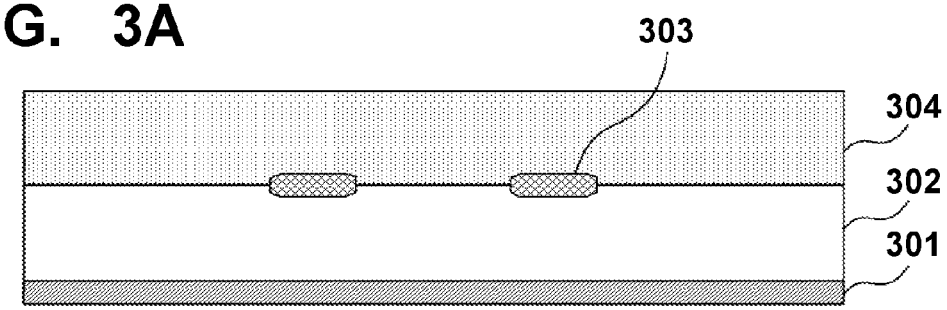
FIGS. 3A to 3D are diagrams illustrating a method of manufacturing a solid-state image sensor according to an embodiment of the present invention.

Next, an example of a method of manufacturing a semiconductor device will be described with reference to FIGS. 3A to 3D. FIGS. 3A to 3D illustrate a CMOS solid-state image sensor as an example of a semiconductor device, but the present invention is also applicable to a CCD solid-state image sensor, a semiconductor memory and other semiconductor devices. First, a configuration of a solid-state image sensor 300 manufactured by a manufacturing method according to the present embodiment will be described with reference to FIG. 3D. FIG. 3D is a cross-sectional view of the solid-state image sensor 300, viewed as focusing attention on a single pixel. The solid-state image sensor 300 may include a photodiode 310 serving as a sensor and two transistors 320 and 330 positioned in the vicinity of the photodiode 310. The transistors 320 and 330 each can be one of a reset transistor for resetting signal charges, an amplifier transistor for amplifying a photodiode signal and a selection transistor for selectively outputting a signal from the amplifier transistor. An isolation region 303 and a P+ impurity region 307d that is positioned below the isolation region 303 and functions as a guard layer may be disposed between the photodiode 310 and the transistor 320 and between the photodiode 310 and the transistor 330. An example of the transistor disposed in the vicinity of the photodiode 310 can be a transistor for transferring charges produced by the photodiode 310.

The photodiode 310 may include a P+ layer 311 positioned on the surface of the semiconductor substrate, an N-type region 312 positioned below the P+ layer 311, and a P-type impurity region 313 positioned below the N-type region 312. In order to enhance the collection efficiency of photoelectrons, the impurity region 313 may be formed at a deep position in the semiconductor substrate. The transistor 320 may include a gate electrode 321, a gate insulating film (not shown), an N+ source region 322, an N+ drain region 323, and a P-type impurity region 324. The transistor 330 may include a gate electrode 331, a gate insulating film (not shown), an N+ source region 332, an N+ drain region 333, and a P-type impurity region 334. In the present embodiment, the transistor 320 is assumed to be a low-threshold transistor that requires a high driving force, and the transistor 330 is assumed to be a high-threshold transistor that requires high off-characteristics. In this case, the transistors may be configured such that the impurity concentration of the channel region of the transistor 320 is lower than that of the channel region of the transistor 330.

Next, each step of a method of manufacturing the solid-state image sensor 300 as described above will be described. First, as shown in FIG. 3A, an N-type substrate 301 is epitaxially grown to form an N-type epitaxial layer 302. The N-type substrate 301 and the N-type epitaxial layer 302 together serve as a semiconductor substrate in the solid-state image sensor 300. An isolation region 303 for isolating an active region is formed on the N-type epitaxial layer 302. Furthermore, a photoresist 304 is uniformly coated on the isolation region 303.

Figure 3B:
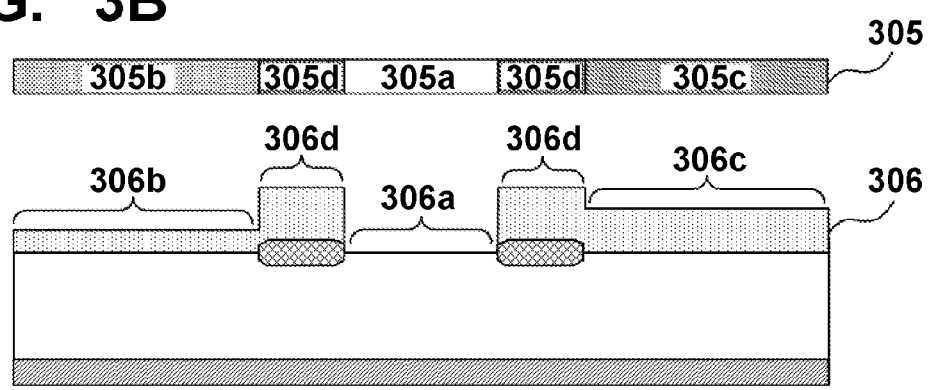

Next, as shown in FIG. 3B, a photolithography step is performed using a photomask 305 so as to form a resist pattern 306. The photomask 305 can be a multi-level photomask including a plurality of regions having different light transmittances. Specifically, the photomask 305 includes a plurality of regions 305a to 305d, and the light transmittance increases in the order from the region 305a to the region 305d. The regions 305a to 305d may have a light transmittance of, for example, 100%, 80%, 60% and 40%, respectively. By using such a photomask 305 to form a resist pattern 306, regions 306a to 306d of the resist pattern 306 become thicker in the order of the region 306a, the region 306b, the region 306c and the region 306d. In particular, the thickness at the region 306a of the resist pattern 306 will be zero. For formation of the resist pattern 306, the above-described method can be used, and thus a detailed description of the method of forming the resist pattern 306 is not given here.

Figure 3C:
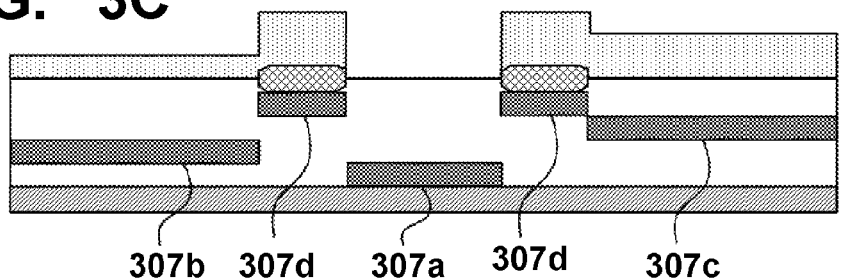
Figure 3D:
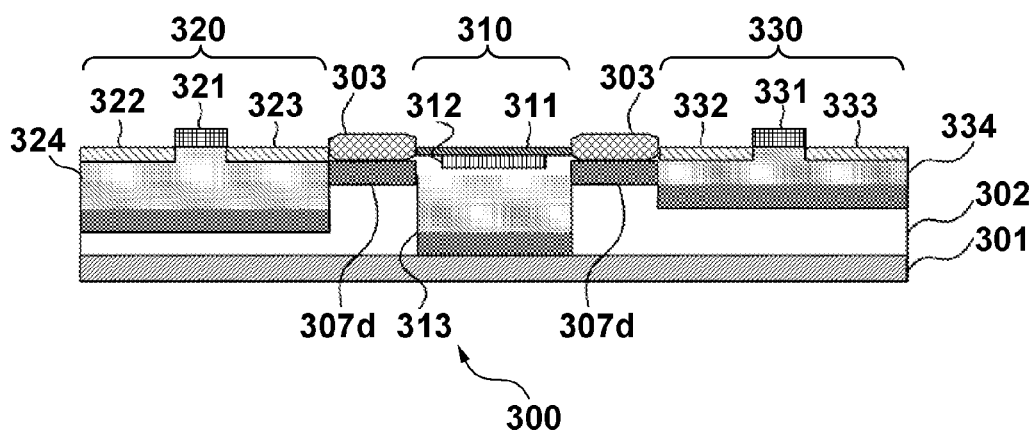

Next, as shown in FIG. 3C, impurity ions (boron, for example) for forming P-type impurity regions are implanted into the N-type epitaxial layer 302 through the resist pattern 306. P-type impurity regions 307a to 307d are thereby formed within the N-type epitaxial layer 302. The depths to the peak positions of the impurity regions 307a to 307d depend on the thicknesses of the regions 306a to 306d of the resist pattern 306, and are thus different from each other. As described above, with the ion implantation using the resist pattern 306 including a plurality of regions having different thicknesses, a plurality of impurity regions having different peak positions can be formed with a single time of ion implantation. As a result, it is possible to reduce the number of steps of the method of manufacturing the solid-state image sensor 300, as well as the time and cost required to manufacture the solid-state image sensor 300. Impurity ions spread beyond the pattern of the resist pattern 306 during ion implantation, and therefore adjacent impurity regions, for example, the impurity region 307d and the impurity region 307c may be in contact with each other.

Next, as shown in FIG. 3D, annealing is performed for activation and thermal diffusion of the impurity ions. With the thermal diffusion, P-type impurity regions 313, 324 and 334 are formed from the impurity regions 307a, 307b and 307c, respectively. The impurity region 307b is formed at a position deeper than the impurity region 307c, and therefore the impurity concentration of the channel region of the transistor 320 is lower than that of the channel region of the transistor 330. As described above, a plurality of transistors having different thresholds can be formed by forming a plurality of impurity regions at different positions where the peak position differs and subjecting the impurity regions to thermal diffusion. Finally, the N+ source regions 322 and 332, the N+ drain regions 323 and 333, the P+ layer 311, the N-type region 312, the gate insulating films, the gate electrodes 321 and 331, and the like are formed to give the solid-state image sensor 300. There is a possibility that the peaks of the impurity regions might be broadened by annealing. In such a case, the positions of the impurity regions can be determined by the boundary between an underlying region such as the N-type epitaxial layer 302 and an impurity region.

As described above, according to the present embodiment, a plurality of impurity regions having different depths to the peak position, which are formed with multiple steps in conventional methods, can be formed with a single step.

Figure 4A:
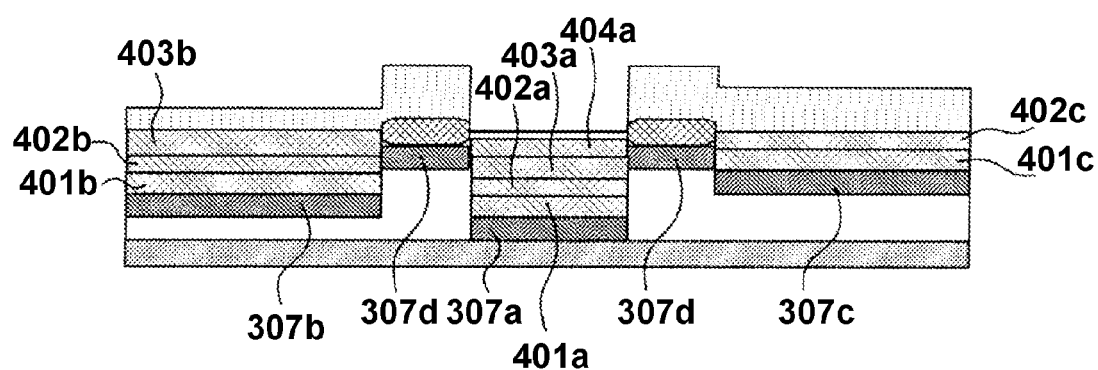
FIGS. 4A and 4B are diagrams illustrating a variation of the method of manufacturing a solid-state image sensor.
Figure 4B:
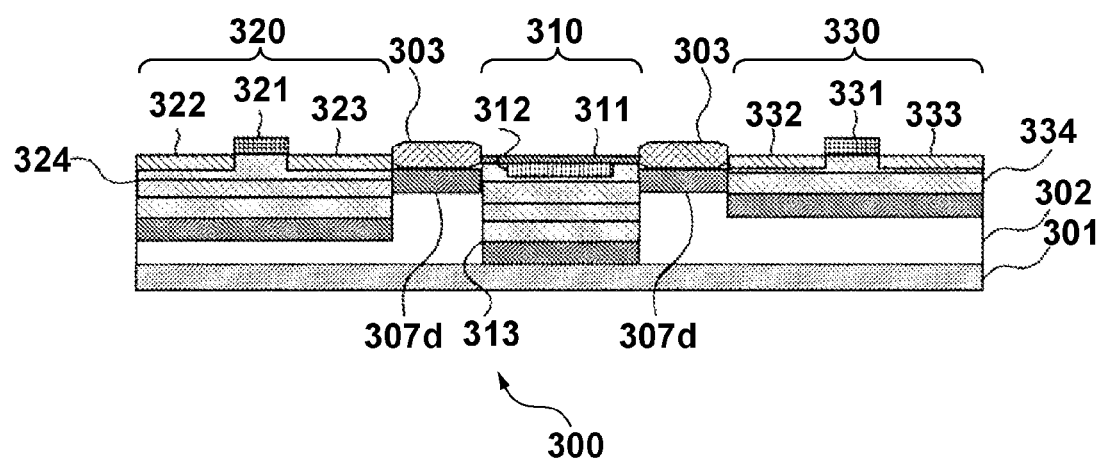

Next, a variation of the method of manufacturing the solid-state image sensor 300 described in connection with FIGS. 3A to 3D will be described with reference to FIGS. 4A and 4B. A feature of this variation lies in the fact that a plurality of times of ion implantation are performed in the step of FIG. 3C. First, in the same manner as in the step described with reference to FIG. 3C, a first time of ion implantation is performed through the resist pattern 306 so as to form the impurity regions 307a, 307b, 307c and 307d. After that, as shown in FIG. 4A, a second time of ion implantation is performed through the same resist pattern 306 by using less ion implantation energy than that used in the first time of ion implantation. With the second time of ion implantation, impurity regions 401a, 401b and 401c are formed at positions shallower than the impurity regions 307a, 307b and 307c. Furthermore, a third time of ion implantation is performed through the same resist pattern 306 by using less ion implantation energy than that used in the second time of ion implantation. With the third time of ion implantation, impurity regions 402a, 402b, and 403c are formed at positions shallower than the impurity regions 401a, 401b and 401c. In the same manner, a fourth time of ion implantation is performed to form impurity regions 403a and 403b, and a fifth time of ion implantation is performed to form an impurity region 404a. No impurity region is formed in a region corresponding to the region 305c by the fourth time of ion implantation.

In the manner described above, by performing ion implantation a plurality of times by varying the ion implantation energy, a plurality of impurity regions having different depths can be formed. Also, by varying the amount (dose) of ion implantation in each time of ion implantation, a desired depth concentration profile can be formed. Consequently, a solid-state image sensor 300 shown in FIG. 4B is obtained. After that, the same processing as that described with reference to FIG. 3D may be performed. In FIG. 4B, the region 324 has four impurity concentration peaks in the depth direction, the region 313 has five impurity concentration peaks in the depth direction, and the region 334 has three impurity concentration peaks in the depth direction. For example, increasing the impurity concentrations of the impurity regions 307a, 307b, 307c and 307d at the deepest positions in the substrate facilitates collection of charges produced at the deep positions in the substrate. This is effective particularly in the case of, for example, a solid-state image sensor in which the region 310 is composed of a photoelectric conversion element such as a photodiode. Furthermore, it is also possible to control spreading of the depletion layer of the photodiode by adjusting the concentration of the impurity region 324.

In the above-described embodiments, a film made of other materials may be used in place of the photoresist used in the step of FIG. 3C. For example, before the photoresist 304 is formed in the step of FIG. 3A, for example, a film made of an inorganic material such as silicon oxide may be formed on the N-type epitaxial layer 302, and the photoresist 304 may be formed thereon. As the inorganic material, for example, silicon oxide or silicon nitride can be used. Then, as shown in FIG. 3B, the photoresist 304 is exposed and patterned. After that, etching is performed using the resist pattern 306 as a mask, and the shape of the resist pattern 306 is transferred to the film made of an inorganic material so as to form an inorganic material pattern. The shape that is transferred may be the same as that of the resist pattern 306. It is also possible to adjust the size of the pattern that is transferred by adjusting the etch rate ratio between the resist pattern and the inorganic material film. After that, the residual resist pattern 306 is removed. In FIG. 3C, ion implantation is performed using, instead of the resist pattern 306, the inorganic material pattern as a mask. With such a method, ions pass through the inorganic material during ion implantation, and therefore the contamination of the semiconductor substrate due to organic material can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-020088, filed Feb. 1, 2011 and 2011-261009, filed Nov. 29, 2011, which are hereby incorporated by reference herein in their entirety.

What is claimed is:

1. A method of manufacturing a solid-state image sensor that includes a semiconductor substrate, the method comprising:
    exposing a photoresist coated on the semiconductor substrate using a photomask including a plurality of regions having different light transmittances;
    developing the photoresist to form a resist pattern including a plurality of regions having different thicknesses that depend on an exposure amount of the photoresist; and
    implanting impurity ions into the semiconductor substrate through the plurality of regions of the resist pattern having different thicknesses to form a plurality of impurity regions whose depths from a surface of the semiconductor substrate to peak positions are different from each other, the plurality of the impurity regions including a first impurity region for forming a photoelectric conversion element, a second impurity region for forming a transistor, and a third impurity region for isolating the photoelectric conversion element and the transistor,
    wherein the depths to the peak positions depend on the thickness of the resist pattern through which the implanted impurity ions pass.

2. The method according to claim 1, further comprising subjecting the impurity ions implanted into the semiconductor substrate to thermal diffusion.

3. The method according to claim 1, wherein in the implanting, the impurity ions are implanted simultaneously through the plurality of regions of the resist pattern having different thicknesses.

4. The method according to claim 1, wherein the photomask is a gray-tone mask or half-tone mask.

5. The method according to claim 1, wherein in the implanting, the implantation of the impurity ions comprises at least first implantation performed with first energy and second implantation performed with energy higher than the first energy.

6. The method according to claim 5, wherein a dose of the first implantation and a dose of the second implantation are different from each other.

7. The method according to claim 1, wherein the semiconductor substrate includes an epitaxial layer epitaxially grown from the substrate.

8. The method according to claim 1, further comprising, before the exposing the photoresist:
    forming an isolation region on the semiconductor substrate; and
    coating the photoresist over the isolation region.

9. The method according to claim 1, wherein the depth from the surface of the semiconductor substrate to a peak position of the first impurity region is deeper than the depth from the surface of the semiconductor substrate to a peak position of the second impurity region.

10. The method according to claim 1, wherein at least one of the plurality of the regions of the resist pattern through which impurity ions are implanted into the semiconductor substrate has an upper surface which is parallel to a surface of the semiconductor substrate.

11. The method according to claim 1, wherein an upper surface of the resist pattern has a step between a region of the resist pattern through which impurity ions are implanted to form the second impurity region and a region of the resist pattern through which impurity ions are implanted to form the third impurity region.

12. A method of manufacturing a solid-state image sensor that includes a semiconductor substrate, the method comprising:
    exposing a photoresist coated on a film made of an inorganic material using a photomask including a plurality of regions having different light transmittances;
    developing the photoresist to form a resist pattern including a plurality of regions having different thicknesses that depend on an exposure amount of the photoresist;
    performing etching using the resist pattern as a mask to form an inorganic material pattern from the inorganic material film, the inorganic material pattern including a plurality of regions having different thicknesses; and
    implanting impurity ions into the semiconductor substrate through the plurality of regions of the inorganic material pattern having different thicknesses to form a plurality of impurity regions whose depths from a surface of the semiconductor substrate to peak positions are different from each other, the plurality of the impurity regions including a first impurity region for forming a photoelectric conversion element, a second impurity region for forming a transistor, and a third impurity region for isolating the photoelectric conversion element and the transistor,
    wherein the depths to the peak positions depend on the thickness of the inorganic material pattern through which the implanted impurity ions pass.

13. The method according to claim 12, wherein the photomask is a gray-tone mask or half-tone mask.

14. The method according to claim 12, wherein in the implanting, the implantation of the impurity ions comprises at least first implantation performed with first energy and second implantation performed with energy higher than the first energy.

15. The method according to claim 14, wherein a dose of the first implantation and a dose of the second implantation are different from each other.

16. The method according to claim 12, wherein the inorganic material comprises silicon oxide or silicon nitride.

17. A method of manufacturing a solid-state image sensor that includes a plurality of impurity regions within a semiconductor substrate, the method comprising:

implanting impurity ions into the semiconductor substrate through a plurality of regions of a resist pattern having different thicknesses to form the plurality of impurity regions whose depths from a surface of the semiconductor substrate to peak positions are different from each other, the plurality of the impurity regions including a first impurity region for forming a photoelectric conversion element, a second impurity region for forming a transistor, and a third impurity region for isolating the photoelectric conversion element and the transistor, wherein the depths to the peak positions depend on the thickness of the resist pattern through which the implanted impurity ions pass.

* * * * *